(12) United States Patent
Balseanu et al.

(10) Patent No.: US 8,148,269 B2
(45) Date of Patent: Apr. 3, 2012

(54) BORON NITRIDE AND BORON-NITRIDE DERIVED MATERIALS DEPOSITION METHOD

(75) Inventors: Mihaela Balseanu, Sunnyvale, CA (US); Christopher D. Bencher, San Jose, CA (US); Yongmei Chen, San Jose, CA (US); Li Yan Miao, San Francisco, CA (US); Victor Nguyen, Novato, CA (US); Isabelita Roflox, Union City, CA (US); Li-Qun Xia, Cupertino, CA (US); Derek R. Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 445 days.

(21) Appl. No.: 12/415,759

(22) Filed: Mar. 31, 2009

(65) Prior Publication Data

US 2009/0263972 A1    Oct. 22, 2009

Related U.S. Application Data

(60) Provisional application No. 61/042,638, filed on Apr. 4, 2008.

(51) Int. Cl.
*H01L 21/302*    (2006.01)
*H01L 21/461*    (2006.01)

(52) U.S. Cl. ........ 438/706; 438/707; 438/708; 438/709; 438/710; 438/714

(58) Field of Classification Search .................. None
See application file for complete search history.

(56) References Cited

U.S. PATENT DOCUMENTS

| | | |
|---|---|---|
| 3,451,840 A | 6/1969 | Hough |
| 4,656,052 A | 4/1987 | Satou et al. |
| 5,270,125 A | 12/1993 | America et al. |
| 5,306,530 A | 4/1994 | Strongin et al. |
| 5,328,810 A | 7/1994 | Lowrey et al. |
| 5,483,920 A | 1/1996 | Pryor |
| 5,534,070 A | 7/1996 | Okamura et al. |
| 5,536,360 A | 7/1996 | Nguyen et al. |
| 5,558,908 A | 9/1996 | Lukacs, III et al. |
| 5,626,922 A | 5/1997 | Miyanaga et al. |

(Continued)

FOREIGN PATENT DOCUMENTS

KR    10-2006-0113162    11/2006

(Continued)

OTHER PUBLICATIONS

Derwent, 2003-741955, Kim.*

(Continued)

*Primary Examiner* — Duy Deo
(74) *Attorney, Agent, or Firm* — Patterson & Sheridan, L.L.P.

(57) ABSTRACT

A method and apparatus are provided to form spacer materials adjacent substrate structures. In one embodiment, a method is provided for processing a substrate including placing a substrate having a substrate structure adjacent a substrate surface in a deposition chamber, depositing a spacer layer on the substrate structure and substrate surface, and etching the spacer layer to expose the substrate structure and a portion of the substrate surface, wherein the spacer layer is disposed adjacent the substrate structure. The spacer layer may comprise a boron nitride material. The spacer layer may comprise a base spacer layer and a liner layer, and the spacer layer may be etched in a two-step etching process.

5 Claims, 8 Drawing Sheets

U.S. PATENT DOCUMENTS

| | | | |
|---|---|---|---|
| 5,837,607 | A | 11/1998 | Quick |
| 5,897,751 | A | 4/1999 | Makowiecki et al. |
| 5,994,762 | A | 11/1999 | Suwanai et al. |
| 6,759,261 | B2 | 7/2004 | Shimokohbe et al. |
| 6,924,191 | B2 | 8/2005 | Liu et al. |
| 6,958,175 | B2 | 10/2005 | Sakamoto et al. |
| 7,064,078 | B2 | 6/2006 | Liu et al. |
| 7,115,525 | B2 | 10/2006 | Abatchev et al. |
| 7,807,578 | B2 * | 10/2010 | Bencher et al. ............... 438/703 |
| 2003/0224217 | A1 | 12/2003 | Byun et al. |
| 2006/0019486 | A1 | 1/2006 | Yu et al. |
| 2006/0207504 | A1 | 9/2006 | Hasebe et al. |
| 2006/0289951 | A1 | 12/2006 | Weimer |
| 2007/0049040 | A1 * | 3/2007 | Bai et al. ...................... 438/712 |
| 2007/0197028 | A1 | 8/2007 | Byun et al. |
| 2008/0292798 | A1 | 11/2008 | Huh et al. |
| 2008/0299776 | A1 * | 12/2008 | Bencher et al. ............... 438/703 |
| 2009/0017640 | A1 | 1/2009 | Huh et al. |

FOREIGN PATENT DOCUMENTS

| | | |
|---|---|---|
| KR | 10-2007-0099933 | 10/2007 |

OTHER PUBLICATIONS

PCT International Search Report and Written Opinion for International Application No. PCT/US2009/039356 dated Oct. 30, 2009.

* cited by examiner

BORON NITRIDE AND BORON-NITRIDE DERIVED MATERIALS DEPOSITION METHOD

CROSS-REFERENCE TO RELATED APPLICATIONS

This application claims benefit of U.S. Provisional Patent Application Ser. No. 61/042,638, filed Apr. 4, 2008, which is incorporated by reference in its entirety.

BACKGROUND OF THE INVENTION

1. Field of the Invention

Embodiments of the present invention generally relate to a method for producing sidewall spacers for gate stacks on semiconductor substrates.

2. Description of the Related Art

Ultra-large-scale integrated (ULSI) circuits typically include more than one million transistors that are formed on a semiconductor substrate and which cooperate to perform various functions within an electronic device. Such transistors may include complementary metal-oxide-semiconductor (CMOS) field effect transistors.

A CMOS transistor includes a gate structure that is disposed between a source region and a drain region defined in the semiconductor substrate. The gate structure (stack) generally comprises a gate electrode formed on a gate dielectric material. The gate electrode controls a flow of charge carriers, beneath the gate dielectric, in a channel region that is formed between the drain region and the source region, so as to turn the transistor on or off. Typically disposed proximate the gate stack is a spacer layer, which forms a sidewall. Sidewall spacers serve several functions, including, electrically isolating the gate electrode from source and drain contacts or interconnects, protecting the gate stack from physical degradation during subsequent processing steps, and providing an oxygen and moisture barrier to protect the gate metal.

A conventional gate stack is formed from materials having dielectric constants of less than about 5 (k<5) and is typically protected by a silicon nitride spacer. Further reduction in transistor sizes will likely require gate layers having dielectric constants of greater than 10 (k>10). If the sidewall spacer is then fabricated from a relatively high k (k>7) material, such as silicon nitride, excessive signal crosstalk between adjacent interconnection lines can occur during use of the device containing the completed gate electrode. While ultra-low k materials (k<3) may be employed as a spacer layer, these materials often lack the necessary structural integrity to survive subsequent processing steps, such as etching steps, and/or requisite oxygen and moisture imperviousness to protect the gate metal from corrosion.

In addition, conventional thermal chemical vapor deposition (CVD) processes used to prepare silicon nitride spacers require high deposition temperature, greater than 600° C. While the nitride spacers deposited at high temperatures have very good conformality (for example ≧95%), while the high deposition temperatures result in large thermal cycle for the gate device and is not compatible with advanced device manufacturing for 0.09 micron technology and beyond.

Therefore, there is a need for low temperature, and low k sidewall spacers for low k gate stacks, wherein the sidewall spacer possesses the desired physical properties of structural stability and hermeticity.

SUMMARY OF THE INVENTION

The present invention provides a method for forming sidewall spacers on a gate stack by depositing one or more layers of boron containing materials and/or silicon-containing materials on a gate stack to produce a spacer.

In one embodiment, a method is provided for processing a substrate including placing a substrate having a substrate structure adjacent a substrate surface in a deposition chamber, depositing a spacer layer on the substrate structure and substrate surface, and etching the spacer layer to expose the substrate structure and a portion of the substrate surface, wherein a portion of the etched spacer layer remain adjacent the substrate structure.

In another embodiment, a method for forming a sidewall spacer for a gate electrode including placing a substrate having a gate structure adjacent a substrate surface in a deposition chamber, flowing a processing gas comprising boron-containing precursor and a nitrogen-containing precursor into the deposition chamber, generating a plasma in the deposition chamber, depositing a boron nitride material layer on the substrate surface and gate structure, and etching the boron nitride material layer to expose the gate structure and the substrate surface, wherein a portion of the boron nitride material layer remains adjacent the substrate structure.

In another embodiment, a method is provided for fabricating a semiconductor mask including providing a semiconductor stack having a sacrificial mask disposed adjacent thereto, depositing a conformal boron nitride material layer on the sacrificial mask and semiconductor stack, etching the boron nitride material layer to provide a spacer mask having spacer lines adjacent to the sidewalls of the sacrificial mask and to expose the top surface of the sacrificial mask, and removing the sacrificial mask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention encompasses forming dielectric material adjacent substrate features, such as forming spacer materials for double patterning processes and for gate stacks by applying a boron-based material to the substrate structures. In one embodiment, a spacer material is formed by depositing and etching a boron nitride material, which material may optionally include hydrogen, carbon, oxygen, silicon, chlorine, and combinations thereof. In another embodiment, a spacer material may be formed by depositing a boron-nitride layer, depositing a liner layer on the boron-nitride layer, etching the liner layer, and etching the boron-nitride layer.

Figure 1:
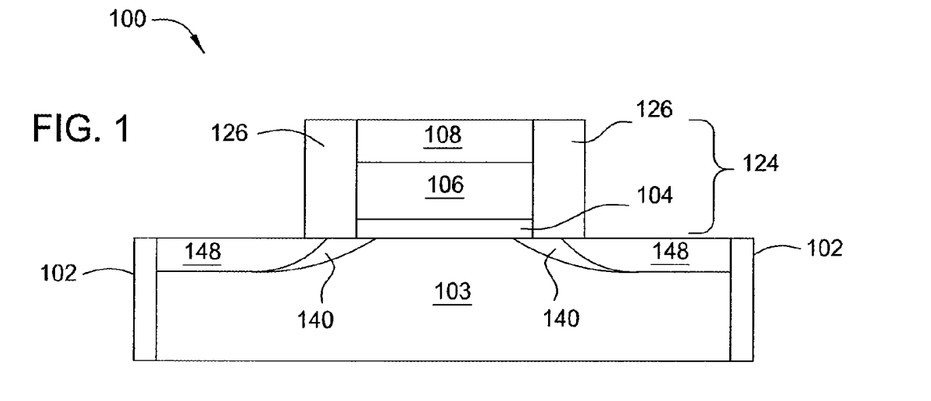
FIG. 1 illustrates a transistor having a gate structure formed according to one embodiment of the invention.

FIG. 1 illustrates a transistor having a gate structure formed according to one embodiment of the invention. Referring to FIG. 1, a plurality of field isolation regions 102 are formed in a substrate 100, for example, a silicon wafer. The plurality of field isolation regions 102 isolate a well region 103 of one type conductivity, for example, p-type, from adjacent wells (not shown) of other type conductivity, for example, n-type. Then, a gate dielectric layer 104 is adjacent, i.e., formed on, the substrate 100 and on isolation regions 102. Typically, gate dielectric layer 104 may be formed by depositing or growing a layer of a material such as silicon oxide ($SiO_n$) and/or silicon oxynitride, which form layers having a dielectric constant less than about 5.0. Recent advances in gate dielectric technology indicate that higher dielectric constant materials (K>10) are desirable for forming the gate dielectric layer 104. Examples of suitable materials to be employed therefore include, but are not limited to, metal oxides ($Al_2O_3$, $ZrO_2$, $HfO_2$, $TiO_2$, $Y_2O_3$, and $La_2O_3$), ferroelectrics (lead zirconate titanate (PZT) and barium strontium titanate (BST)), amorphous metal silicates ($HfSi_xO_y$ and $ZrSi_xO_y$), amorphous silicate oxides ($HfO_2$, and $ZrO_2$), and paralectrics ($Ba_xSr_{1-x}TiO_3$ and $PbZr_xTi_{1-x}O_3$). High k layers containing these materials may be formed by various deposition processes.

Further, an electrically conductive gate electrode layer 106 is blanket deposited over gate dielectric layer 104. Generally, the gate electrode layer 106 may comprise a material such as, but not limited to, doped polysilicon, undoped polysilicon, silicon carbide, or silicon-germanium compounds. However, contemplated embodiments may encompass a gate electrode layer 106 containing a metal, metal alloy, metal oxide, single crystalline silicon, amorphous silicon, silicide, or other material well known in the art for forming gate electrodes.

A hard mask layer 108, such as a nitride layer, is deposited, such as by a CVD process, over gate electrode layer 106. A photolithography process is then carried out including the steps of masking, exposing, and developing a photoresist layer to form a photoresist mask (not shown). The pattern of the photoresist mask is transferred to the hard mask layer by etching the hard mask layer to the top of the gate electrode layer 106, using the photoresist mask to align the etch, thus producing a hard mask layer 108 over the gate electrode layer 106.

The structure is further modified by removing the photoresist mask and etching the hard mask layer 108 and gate electrode layer 106 down to the top of the gate dielectric layer 104, using the hard mask to align the etch, thus creating a conductive structure including the remaining material of gate electrode layer 106 underneath the hard mask layer 108. Continuing the processing sequence, the gate dielectric layer 104 is etched to the top of the substrate 100 and to the tops of the isolation regions 102. The gate electrode layer 106 and the gate dielectric layer 104 together define a composite structure, sometimes known as a gate stack 124, or gate, of an integrated device, such as a transistor, as shown in FIG. 1.

In further processing of the transistor, tips, or shallow source/drain extensions, 140, are formed by utilizing a tip implant process. The gate electrode layer 106 protects the substrate region beneath the gate dielectric layer 104 from being implanted with ions. A rapid thermal process (RTP) anneal may then be performed to drive the source/drain extensions 140 partially underneath the gate dielectric layer 104.

Optionally, a conformal oxide layer (not shown) is deposited over the entire substrate surface. This oxide layer is used to protect the silicon surface from atomic migration, such as nitrogen materials from the spacer layer 126. The oxide layer may be deposited with TEOS source gas in a low pressure chemical vapor deposition chamber at high temperature (>600° C.). The oxide layer may additionally be used to relax the stress between silicon substrate and the spacer layer 126 while protecting the gate corners from the space layer 126. If low k and non-silicon-nitride materials are used for the spacer layer 126, such as boron nitride and derivatives described herein, the oxide layer may not be used or may be replaced by other low k material.

Afterwards, in one embodiment of the invention, a spacer layer 126, with thickness in the range between about 200 Å to about 1000 Å, preferably between about 400 Å to about 800 Å, is blanket deposited over the top of the gate stack 124 and along the entire length of the sides of the gate stack 124, including the entire length of the sidewalls of the gate electrode layer 106 and the gate dielectric layer 104. At the same time, the spacer layer 126 is deposited on top of any exposed portion of the substrate 100 or isolation regions 102. The spacer layer 126 may comprises one or more nitride layers, such as the boron nitride material layer described herein, which may be deposited by chemical vapor deposition, such as by plasma-enhanced chemical vapor deposition.

The spacer layer 126 is then etched to remove the spacer layer 126 from the top of the gate electrode layer 106 as well as from the top surface of the isolation regions 102 and from most of the top surface of the substrate 100 except immediately adjacent the gate stack 124. In one embodiment of the etch process, the spacer layer is etched by an anisotropic etch to leave a portion of the spacer layer 126 along the entire length of the sidewalls of both the gate electrode layer 106 and the gate dielectric layer 104, thus forming a sidewall spacer layer 126. In an alternative embodiment, an optional liner layer 127 may be deposited with the spacer layer 126, and a multiple etching process as described herein may be used.

Next, the substrate 100 is subjected to a deep, high dose implant process to form deep junction source/drain regions 148 in the well region 103. The deep implant includes implanting ions with the same conductivity type impurities used to form the source/drain extensions 140. At the same time, if the electrically conductive gate electrode comprises polysilicon, the deep implant process can be used to dope the polysilicon in the gate electrode layer 106 if not previously doped. An activation anneal may be performed to activate the source/drain extensions 140 and deep junction source/drain regions 148. The anneal may be performed with a rapid thermal process (RTP).

Figure 2A:
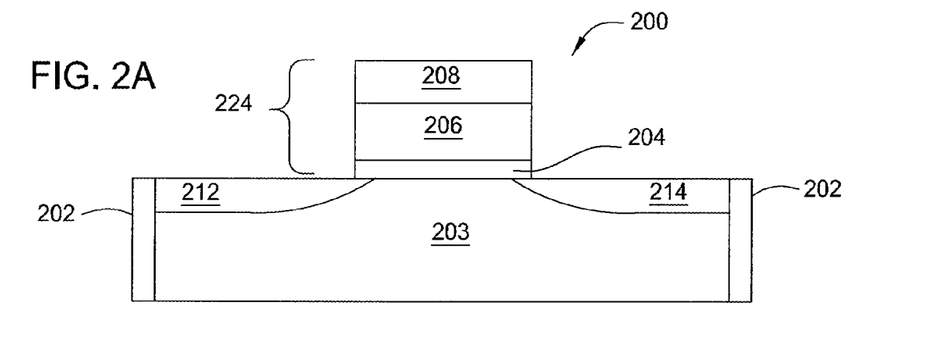
FIGS. 2A-2E illustrates a layering process for forming spacers according to one embodiment of the invention.

FIGS. 2A-2E illustrate an integration scheme that includes a boron-containing spacer layer material. FIG. 2A shows a transistor structure 200 on a substrate (not shown). The transistor structure 200 comprises a gate stack 224. The gate stack 224 includes a gate dielectric layer 204 and a gate electrode layer 206. A hard mask layer 208 is formed on the gate electrode layer 206. The gate stack 224 is between source region 212 and drain region 214. Field isolation regions 202 formed in the structure isolate a well 203 of one type of conductivity, for example, an n-type (NMOS), from adjacent wells (not shown) of another type of conductivity, for example, p-type.

Figure 2B:
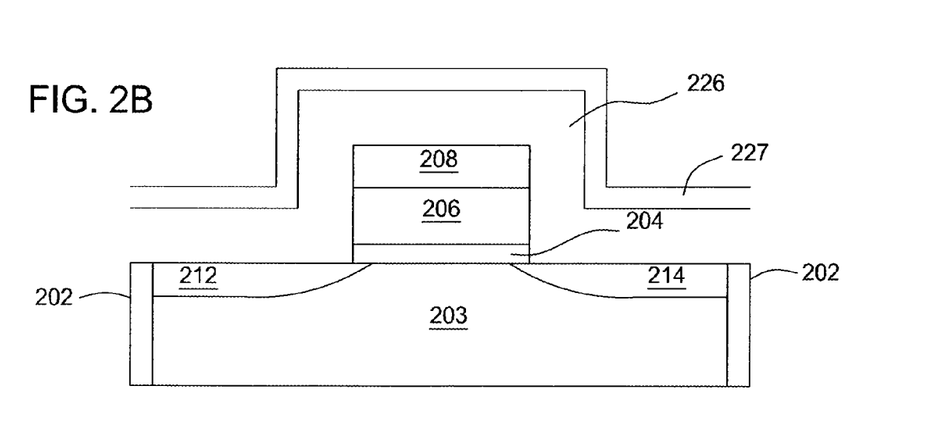

A spacer layer 226 and liner layer 227 are deposited and etched to contact the sidewalls of the gate stack 224. A spacer layer 226 material, such as the boron-nitride material and derivatives thereof described herein, is deposited over the gate stack 224 and the source/drain regions 212, 214. An optional liner layer 227 is deposited on the spacer layer 226 as shown in FIG. 2B. The line layer 227 may comprise a nitride material, such as silicon nitride, and may be deposited to a thickness between about 1% and about 99%, for example, between about 10% and about 20% of the total thickness of the spacer layer 226 and liner layer 227. While the following description is directed to the inclusion of the optional liner layer 227, the invention contemplates the subsequent process being performed without the presence of a liner layer.

Figure 2C:
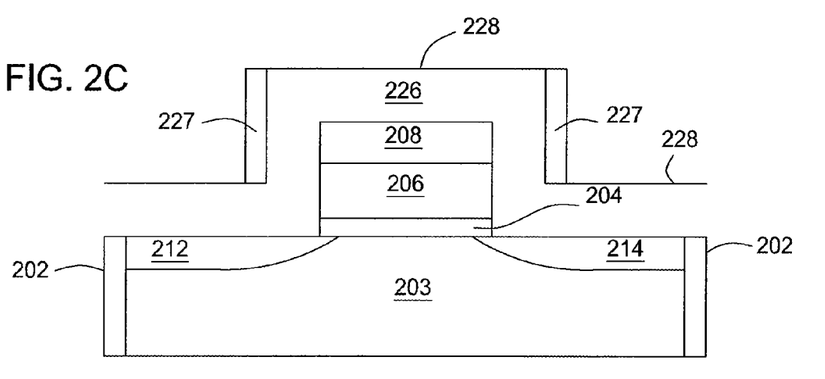

The liner layer 227 may then be anisotropically etched to expose the horizontal portions of the underlying spacer layer material 228 of the spacer layer 226 as shown in FIG. 2C. The anisotropic etching process may comprise a plasma or non-plasma etching process using a chemical etchant gas, such as a hydrogen free fluorocarbon including for example, $CF_4$, and/or a hydrogen containing fluorocarbon, including, for example, $CHF_3$, and an optional inert gas, such as helium (He).

Figure 2D:
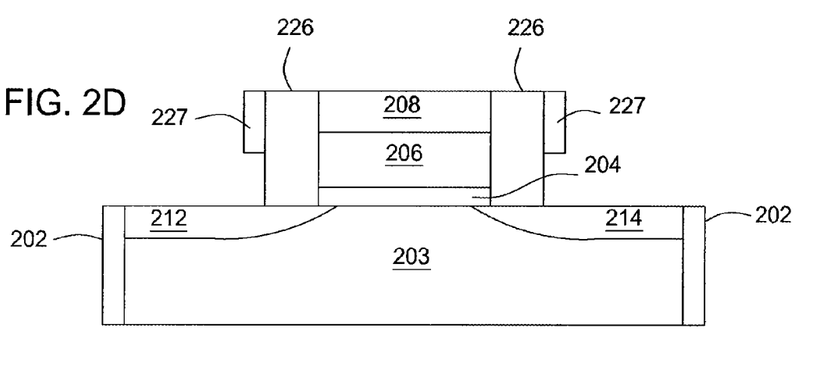

The exposed underlying spacer layer 226 material may then be isotropically etched to expose the top portion of the gate stack 224 and source/drain regions 212, 214, to form spacers of spacer layer 226 and line layer 227 as shown in FIG. 2D. Alternatively, the liner layer 227 may be completely or substantially removed from the spacer layer 226 during the spacer layer 226 etch process or by a subsequent processing step. The isotropic etching process may comprise a plasma or non-plasma etching process using a chemical etchant gas, such as a hydrogen free fluorocarbon including for example, $C_2F_2$, and/or a hydrogen containing fluorocarbon, including, for example, $CHF_3$, an oxidizing gas, including, for example, oxygen ($O_2$), and an optional inert gas, such as argon (Ar).

Figure 2E:
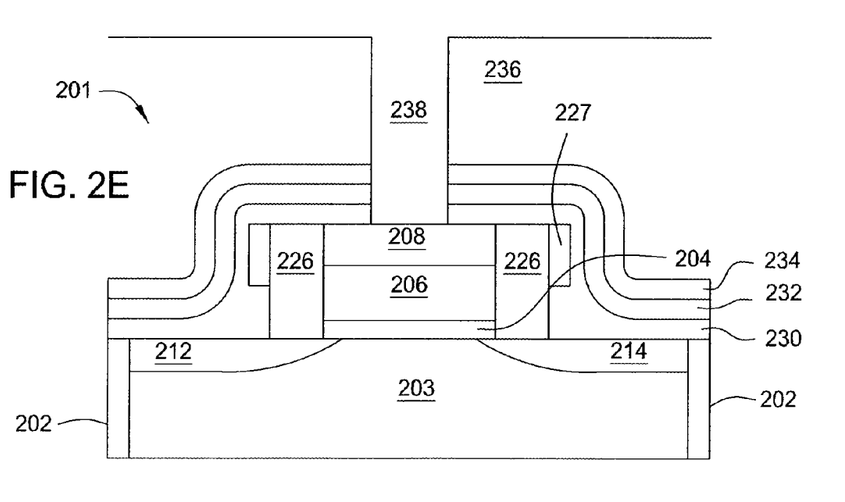

FIG. 2E illustrates the remaining deposition layer and via formation for the device 201. A liner 230 is deposited on the structure 200, and strain-inducing layer 232, which may be a boron-containing material, is deposited on the liner 230. A cap 234 is then deposited on the strain-inducing layer 232. A pre-metal dielectric layer (PMD) 236 is then deposited on the cap 234 and treated with chemical mechanical polishing (CMP). The pre-metal dielectric layer 236 is then patterned, and the pre-metal dielectric layer 236, the cap 234, strain-inducing layer 232, such as a boron-containing film, and liner 230 are etched to form a contact via 238 to the gate stack 224.

The boron nitride layers provided herein may also be used as strain-inducing layers. For example, a boron nitride layer may be deposited over a gate structure to induce strain in the channel region of a transistor. The strain-inducing boron nitride layer may be used with a liner underneath it and/or a cap on top of it. The liner and cap layers have a lower boron content than the strain-inducing boron containing layer. The lower boron content of the liner and cap layers extends the use of the strain-inducing boron nitride layer by providing better insulating properties, such as reduced leakage current, compared to the higher boron content, strain-inducing boron nitride layers.

The liner 230 and cap 234 may be silicon nitride, boron nitride, or boron oxide layers, for example. The liner 230 may have a thickness of between about 2 Å and about 500 Å. The boron nitride and boron oxide layers may be deposited according to any of the methods provided herein for forming the boron nitride layers with the exception that the boron nitride and boron oxide layers are deposited under conditions sufficient to provide a lower boron concentration in the boron nitride or oxide layer relative to the boron nitride layer.

The foregoing embodiments of a transistor structure and method of its formation are merely illustrative. Additional embodiments of gate electrodes and alternative methods for their formation may be employed to practice the invention. Further details concerning exemplary methods and apparatuses for forming gate stacks are disclosed in commonly assigned U.S. patent application Ser. No. 10/612,642, filed Jul. 1, 2003, which claims priority to U.S. provisional patent application Ser. No. 60/393,393, filed Jul. 2, 2002, both of which are incorporated herein by reference to the extent not inconsistent herewith.

In another embodiment, a method for fabricating a semiconductor mask is provided. A semiconductor stack having a sacrificial mask comprising a series of lines and a spacer mask of spacer lines adjacent to the sidewalls of the series of lines may be provided. The spacer lines comprise the boron nitride material described herein. The sacrificial mask is then removed to form the semiconductor mask. Optionally, the spacer mask may then be cropped to provide a cropped spacer mask.

The spacer mask may be formed by first depositing a spacer layer above the semiconductor stack and conformal with the sacrificial mask, etching the spacer layer to provide the spacer mask having spacer lines adjacent to the sidewalls of the series of lines of the sacrificial mask and to expose the top surface of the sacrificial mask, and removing the sacrificial mask. The spacer mask pattern is subsequently transferred to a semiconductor stack.

Optionally, prior to removal of the sacrificial mask a photoresist layer is deposited and patterned above the spacer mask to expose a portion of the spacer mask and exposed portions of the spacer mask are etched to crop the spacer mask. In a further option, the spacer mark is cropped following removal of the sacrificial mask. As each pair of spacer regions of the spacer mask associated with each line of the sacrificial mask may be connected with the preference that the lines in the spacer mask that are discontinuous with one another, portions of the spacer mask that wrap around the ends of the lines in the sacrificial mask may be cropped in a patterning/etch process.

The described process allows for the frequency of a lithographic pattern to be doubled by the spacer lines formed adjacent to the sidewalls of a lithographically patterned sacrificial mask to form a semiconductor patterning mask providing substantially the same critical dimension for each line, or the same feature width, but having double the density of lines in a particular region. For example, in accordance with an embodiment of the present invention, the pitch of the sacrificial mask is selected to be 4 in order to ultimately provide a spacer mask having a pitch of 2.

The fabrication of a spacer mask may include a cropping process sequence, through which a sacrificial mask is retained to provide structural integrity to the spacer mask. FIGS. 3A-H illustrate cross-sectional and top-down views accompanying to an exemplary method as applied to a semiconductor stack, in accordance with an embodiment of the present invention.

Figure 3A:
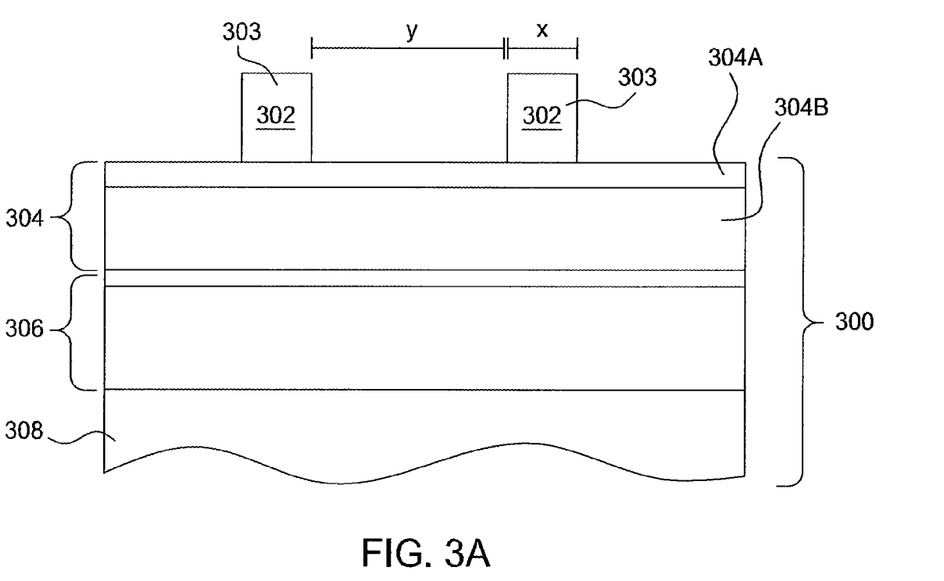
FIGS. 3A-3H illustrate cross-sectional views representing exemplary embodiments of spacer mask fabrication processes.

In FIG. 3A a patterned photoresist layer 302 is provided above a semiconductor stack 300. In one embodiment, the semiconductor stack 300 is comprised of a first mask stack 304 and a second mask stack 306 above a semiconductor layer 308.

The patterned photoresist layer 302 may be comprised of any material suitable for use in a lithographic process, such as positive or negative photoresists, of which preferred positive photoresist materials are selected from the group consisting of a 248 nm resist, a 193 nm resist, a 157 nm resist and a phenolic resin matrix with a diazonaphthoquinone sensitizer, and preferred negative photoresist material selected from the group consisting of poly-cis-isoprene and poly-vinyl-cinnamate.

The patterned photoresist layer 302 may have any dimensions suitable for a spacer mask fabrication process. For example, a width, X, of each feature 303 of the patterned photoresist layer 302 may substantially correlate with the desired critical dimension of a semiconductor device feature, such as the width of a gate electrode, and may be between about 10 nanometers and about 100 nanometers. The widths of the spacer lines of the spacer mask may be substantially the same width of the features 303 of the patterned photoresist layer 302. The spacing, Y, between lines may be selected to optimize a frequency doubling scheme, and the spacing between subsequently formed spacer lines is targeted to be substantially equal to the width of each spacer region. For example, if the frequency of features is to be doubled, the spacing Y between each feature 303 in the patterned photoresist layer 302 is approximately equal to 3 times the value width X, as depicted in FIG. 3A. In a specific embodiment, 193 nm lithography is used to generate the patterned photoresist layer 302 having a feature width of approximately 45 nanometers and a spacing between features of approximately 135 nanometers. Additionally, the pitch of the patterned photoresist layer 302 is selected to be approximately 4 in order to ultimately provide a spacer mask with spacer lines having a pitch of approximately 2.

The approximate 3:1 spacing to width ratio for the features of the patterned photoresist layer 302 may be achieved by over-exposing a positive photoresist layer at the exposure operation or by trimming a photoresist layer subsequent to a lithographic/development process. For example, the patterned photoresist layer 302 is a 193 nm positive photoresist trimmed by using a plasma etch chemistry. Although for a frequency doubling scheme the ideal width of each feature in the patterned photoresist layer 302 is ¼ the pitch of the patterned photoresist layer 302, the initial targeted width may be required to be slightly thicker to compensate for the etch process used to pattern the first mask stack 304. Thus in accordance with an embodiment of the present invention, the initial width of each line in the patterned photoresist layer 302 is targeted to be between 0.281 and 0.312 times the pitch.

Figure 3B:
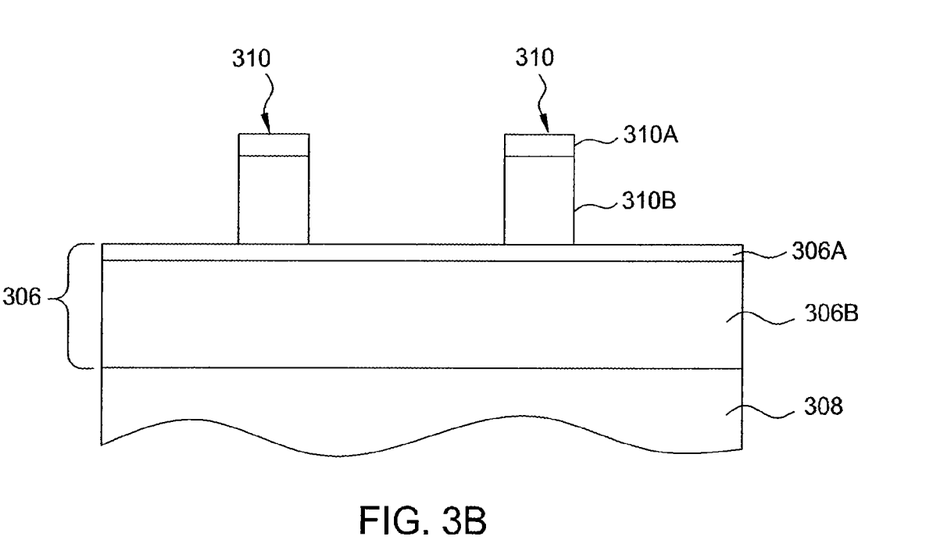

Referring to FIG. 3B, the image of the patterned photoresist layer 302 is transferred to the first mask stack 304 by an etch process to form a sacrificial mask 310. The etch process used to transfer the image may be any process suitable to transfer substantially the same image from the patterned photoresist layer 302 to the first mask stack 304.

The first mask stack 304 (sacrificial mask 310) may comprise any material or combination of materials suitable to act as a sacrificial mask in a spacer mask fabrication process and may comprise a single material as indicated by the single shading depicted in FIG. 3A or two or more materials, of which a two layer material 304A, 304B is also shown in FIG. 3A. The composition and thickness of first mask stack 304 is preferably comprised of a material suitable for etching with an etch process during which the patterned photoresist layer 302 is retained substantially intact. For example, the patterned photoresist layer 302 may comprise a carbon-based material and the first mask stack 304 may comprise a material selected from the group consisting of silicon nitride, silicon oxide and amorphous or polycrystalline silicon. An etch process using gases selected from the group consisting of $CH_2F_2$ and $CHF_3$ may be used when the first mask stack 304 comprises silicon nitride, an etch process using gases selected from the group consisting of $C_4F_8$ and $CHF_3$ may be used when the first mask stack 304 comprises silicon oxide, and an etch process using gases selected from the group consisting of $Cl_2$ and HBr may be used when the first mask stack 304 amorphous or polycrystalline silicon.

In accordance with an embodiment of the present invention, the thickness of the first mask stack 304 comprised of a single material is selected to optimize the subsequent formation of a spacer mask in a frequency doubling scheme. The thickness of the first mask stack 304 may be sufficiently small to prevent spacer mask line-collapse of a subsequently formed spacer mask and sufficiently large to enable critical dimension control of the spacer mask lines. The thickness of the first mask stack 304 comprised of a single material which may be in the range between about 4.06 and about 5.625 times the targeted line width of the sacrificial mask 310.

In accordance with an alternative embodiment of the present invention, the first mask stack 304 is comprised of a first hardmask layer 304A above a first mask layer 304B, as indicated by the two layers depicted in FIG. 3A to form the sacrificial mask 310 of a sacrificial hardmask portion 310A above a sacrificial mask portion 310B, as depicted in FIG. 3B. The first hardmask layer 304A and the first mask layer 304B may be patterned with the image of the patterned photoresist layer 302 in two distinct etch operations with the first hardmask layer 304A comprising any material suitable for etching with an etch process that is substantially non-impactful to the patterned photoresist layer 302 and the first mask layer 304B) comprising a material with etch characteristics similar to the etch characteristics of the patterned photoresist layer 302. Under such a regime, it is believed that the first hardmask layer 304A is used to preserve the image from the patterned photoresist layer 302 during the subsequent etch of the first mask layer 304B.

The patterned photoresist layer 302 and the first mask layer 304B may comprise carbon-based materials and the first hardmask layer 304A may comprise a material selected from the group consisting of silicon nitride, silicon oxide and amorphous or polycrystalline silicon. The etch process for the first hardmask layer 304A and the first mask layer 304B may be the same etch processes as described for first mask stack 304 described herein. The thickness of the first hardmask layer 304A may be sufficiently small to enable highly selective etching relative to the patterned photoresist layer 302 and sufficiently large to avoid pinholes that may undesirably expose the first mask layer 304B. In one embodiment, the thickness of the first hardmask layer 304A is in the range between about 20 nanometers and about 50 nanometers.

The first mask layer 304B may have similar etch characteristics to the patterned photoresist layer 302, and the thicknesses of the patterned photoresist layer 302 and the first mask layer 304B are selected such that all portions of the patterned photoresist layer 302 remaining subsequent to the etch of the first hardmask layer 304A are removed during the etch of the first mask layer 304B. For example, in accordance with an embodiment of the present invention, both the patterned photoresist layer 302 and the first mask layer 304B are comprised substantially of carbon atoms. In one embodiment, the first mask layer 304B is comprised of a mixture of $sp^3$ (diamond-like)-, $sp^2$ (graphitic)- and $sp^1$(pyrolitic)-hybridized carbon atoms formed from a chemical vapor deposition process using hydrocarbon precursor molecules. Such a film may be known in the art as an amorphous carbon film or Advanced Patterning Film™ (APF). An etching process by using gases selected from the group consisting of the combination of $O_2$ and $N_2$ or the combination of $CH_4$ and $N_2$ and O2 may be used to etch a first mask layer 304B comprising amorphous carbon. In a particular embodiment, substantially all of the patterned photoresist layer 302 is removed in the same etch operation as that used to pattern the first mask layer 304B. The thickness of the first mask layer 304B may be sufficiently small to prevent spacer mask line-collapse of a subsequently formed spacer mask and sufficiently large to enable critical dimension control of the spacer mask lines. In one embodiment, the total thickness of the first mask stack 304 comprised of the first hardmask layer 304A and the first mask layer 304B is in the range between about 4.06 and about 5.625 times the targeted line width of the sacrificial mask 310.

Referring again to FIG. 3B, the second mask stack 306 comprises a second hardmask layer 306A above a second mask layer 306B. The second hardmask layer 306A may have any properties suitable to protect the second mask layer 306B from the etch process used to form the sacrificial mask 310. The first mask stack 304 may comprise a single material as described herein, and such material is etched selective to the material of the second hardmask layer 306A. For example, when the first mask stack 304 is comprises silicon nitride, the second hardmask layer 306A may comprise a material selected from the group consisting of silicon oxide and amorphous or polycrystalline silicon. In another example, when the first mask stack 304 is comprises silicon oxide, the second hardmask layer 306A may comprise a material selected from the group consisting of silicon nitride and amorphous or polycrystalline silicon. In a further example, when the first mask stack 304 is comprises amorphous or polycrystalline silicon, the second hardmask layer 306A may comprise a material selected from the group consisting of silicon nitride and silicon oxide.

In accordance with an alternative embodiment of the present invention, the first mask stack 304 is comprised of a first hardmask layer 304A and a first mask layer 304B. In one embodiment, the first mask layer 304B is comprised of an amorphous carbon film etched by gases selected from the group consisting of the combination of $O_2$ and $N_2$ or the combination of $CH_4$ and $N_2$ and $O_2$ and the second hardmask layer 306A is comprised of a material selected from the group consisting of silicon nitride, silicon oxide and amorphous or polycrystalline silicon. The thickness of the second hardmask layer 306A may be sufficiently small to enable subsequent highly selective etching relative to the second mask layer 306B and sufficiently large to avoid pinholes that may undesirably expose the second mask layer 306B to the etch process applied to the first mask stack 304. In one embodiment, the thickness of the second hardmask layer 306A is in the range between about 15 and about 40 nanometers.

Figure 3C:
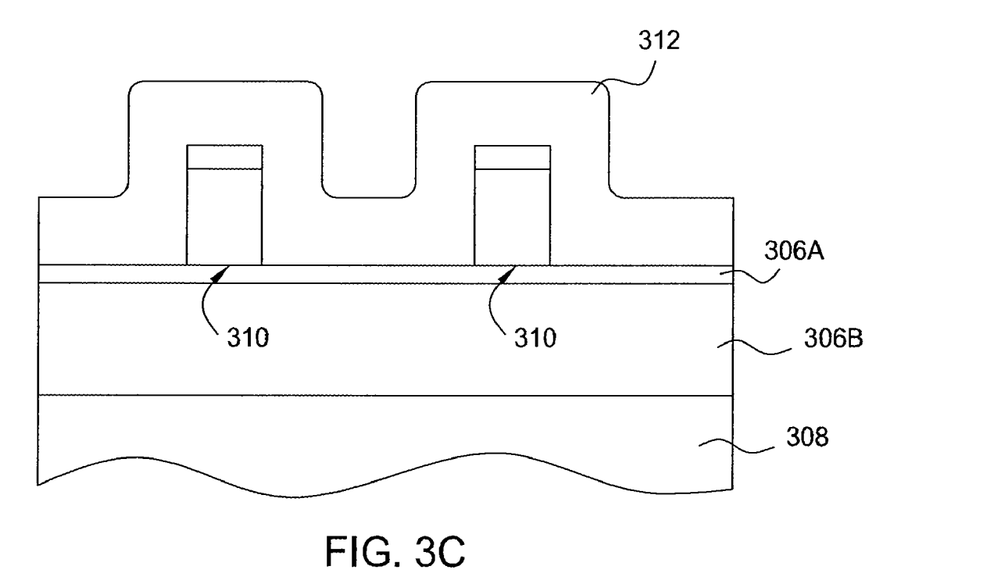

Referring to FIG. 3C, a spacer layer 312 is deposited conformal over the sacrificial mask 310 and above the second hardmask layer 306A. The spacer layer 312 is the source of material for what will ultimately become a spacer mask for use in a frequency doubling scheme. The spacer layer 312 may comprise the boron nitride material described herein. The thickness of the spacer layer 312 may be selected to determine the width of the features in a subsequently formed spacer mask, for example, the thickness of the spacer layer 312 is substantially the same as the width of the features of the sacrificial mask 310, as depicted in FIG. 3C. The thickness of the spacer layer 312 may be greater than the width of the features 303 the sacrificial mask to compensate for the etch process used to pattern the spacer layer 312. The thickness of the spacer layer 312 may be about 1.06 times the width of the features of the sacrificial mask 310 or the desired feature width of the lines in a subsequently formed spacer mask.

Figure 3D:
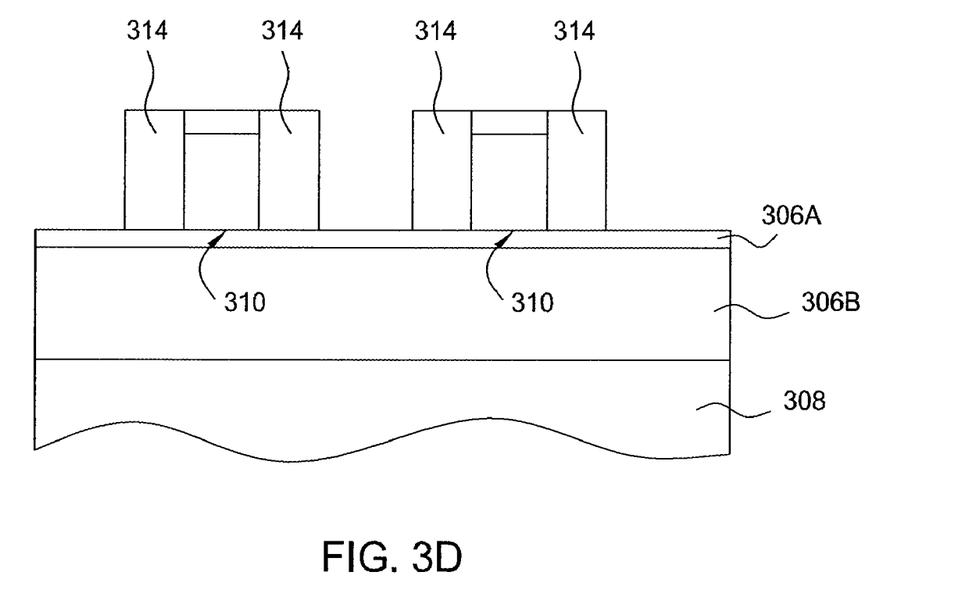

Referring to FIG. 3D, the spacer layer 312 is etched to provide the spacer mask 314 and to expose the top surfaces of the sacrificial mask 310 and the second hardmask layer 306A. The lines of the spacer mask 314 are conformal with the sidewalls of the features of the sacrificial mask 310. FIG. 3D illustrates that there are two lines from the spacer mask 314 for every line of the sacrificial mask 310. The spacer layer 312 may be etched by any process suitable to provide well-controlled dimensions, for instance, to maintain a width of critical dimension of the sacrificial mask 310. The spacer layer 312 may be etched until the lines of the spacer mask 314 are substantially the same height as the features of the sacrificial mask 310, as depicted in FIG. 3D. The lines of the spacer mask 314 may be recessed slightly below the top surface of the features of the sacrificial mask 310 in order to ensure that the continuity of the spacer layer 312 is broken above and between the lines of the spacer mask 314. The width of the top surface of each line of the spacer mask 314 may be substantially the same as the width at the interface of the spacer mask 314 and the second hardmask layer 306A, as depicted in FIG. 3D.

The spacer layer 312 may also be etched to form the spacer mask 314 (for example, FIG. 3D) with high etch selectivity to the sacrificial mask 310 for a single layer, and to the first hardmask layer 304A for a stacked layer, and the second hardmask layer 306A. In a specific embodiment of the present invention, the etch process used to form the spacer mask 314 is end-pointed upon exposure of the top surfaces of the sacrificial mask 310 and the second hardmask layer 306A. In a particular embodiment, a slight over-etch is applied following the end-point detection to ensure that the lines of the spacer mask 314 are discontinuous from feature to feature (for example line-to-line) of the sacrificial mask 310. An example of a suitable etch process for a spacer layer 312 comprising a boron nitride material includes a plasma or non-plasma etching process using a chemical etchant gas, such as a hydrogen free fluorocarbon including for example, $C_2F_2$, $CF_4$, or combinations thereof, and/or a hydrogen containing fluorocarbon, including, for example, $CHF_3$, an oxidizing gas, including for example, oxygen ($O_2$), and an optional inert gas, such as argon (Ar) or helium.

In an alternate process for forming the spacer mask 314 as shown in FIGS. 3C-3D, a dual spacer layer may be utilized.

FIGS. 3C', 3C'', and 3D', a dual spacer layer comprising a base spacer layer 313 and a liner layer 315 are deposited conformally over the sacrificial mask 310 and above the second hardmask layer 306A. The base spacer layer 313 is initially deposited conformally over the sacrificial mask 310 and above the second hardmask layer 306A and comprises the boron-nitride material and derivatives thereof described herein. The liner layer 315 is deposited on the base spacer layer 313' as shown in FIG. 3C'. The line layer 315 may comprise a nitride material, such as silicon nitride, and may be deposited to a thickness between 1% and 90% of the total thickness of the spacer layer 312, i.e., the base spacer layer 313 and the liner layer 315.

The liner layer 315 may then be anisotropically etched to expose the horizontal portions of the underlying base spacer layer 313 of the spacer layer 312 as shown in FIG. 3C''. The anisotropic etching process may comprise a plasma or non-plasma etching process using a chemical etchant gas, such as a hydrogen free fluorocarbon including for example, $C_2F_2$, $CF_4$, or combinations thereof, and/or a hydrogen containing fluorocarbon, including, for example, $CHF_3$, an oxidizing gas, including for example, oxygen ($O_2$), and an optional inert gas, such as argon (Ar) or helium.

The exposed material of the underlying base spacer layer 313 and a portion of the liner layer 315 may then be isotropically etched to expose the top portion of the sacrificial mask to form spacer mask 314 with liner layer 315 formed thereon as shown in FIG. 3D'. A suitable isotropic etch process may be one of the etch processes described herein for spacer layer 312 etching. Alternatively, the liner layer 127 may be completely or substantially removed from the spacer mask 314 during the base spacer layer 313 etch process or by a subsequent processing step.

Figure 3E:
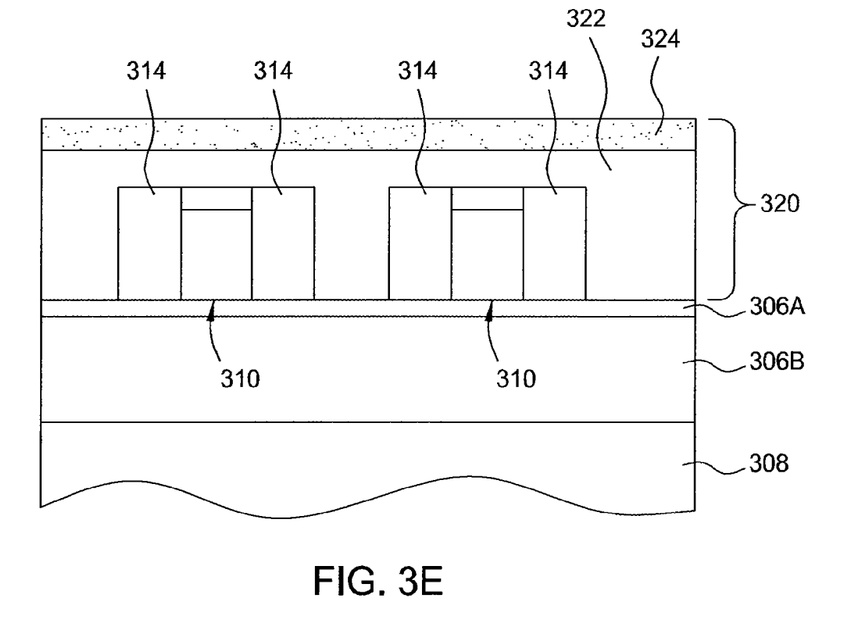

Referring to FIGS. 3E and 3E', the spacer mask 314 may have materials from the sacrificial mask 310 that remain continuous around the ends of each of the lines of the sacrificial mask 310, as depicted by end-portions 316 of the spacer mask 314 illustrated in the top-down view of FIG. 3E'. Such continuity between pairs of spacer lines may be removed by a selective etching of the end-portions 316 that are exposed by a window region 330 upon patterning the photoresist stack 320, as depicted in FIG. 3E'. The photoresist stack 320 is deposited above the spacer mask 314 and the exposed portions of the sacrificial mask 310 and the second hardmask layer 306A.

Returning to FIG. 3E, a photoresist stack 320 may have a photoresist layer 324 comprised of any material described in association with the patterned photoresist layer 302 from FIG. 3A. Additionally, the photoresist stack 320 may comprise a bottom-anti-reflective-coating (BARC) layer 322 in between the photoresist layer 324 and the spacer mask 314 in order to provide a flat surface for the photoresist layer 324, as depicted in FIG. 3E. The BARC layer may be a spin-on glass material having an organic group. Alternatively, the photoresist stack 320 is comprised entirely of a photoresist layer. The photoresist stack 320 may be deposited by any process that provides a flat top surface for the photoresist stack 320. For example, in accordance with an embodiment of the present invention, the photoresist stack 320 comprises the photoresist layer 324 above the BARC layer 322 and both the photoresist layer 324 and the BARC layer 322 are deposited by a spin-on process, and when the photoresist stack 320 substantially comprises a photoresist layer, the photoresist layer may be deposited by a spin-on process. While FIGS. 3E and 3E' illustrate the retention of the sacrificial mask 310, the invention contemplates that the spacer mask 314 process may occur after removal of the sacrificial mask 310 material.

The photoresist stack 320 may be patterned by any lithographic process described in association with the patterning of the patterned photoresist layer 302 from FIG. 3A to form a window region 330 that exposes the end-portions 316 of the spacer mask 314. The size of the window region 330 may be any dimension suitable to crop the spacer mask 314. The window region 330 may expose at least the entire end-portions 316 of the spacer mask 314. The dimensions of the window region 330 may be selected to also expose a portion of the sacrificial mask 310 to accommodate for any slight offset in the patterning and, hence, cropping process.

Figure 3F:
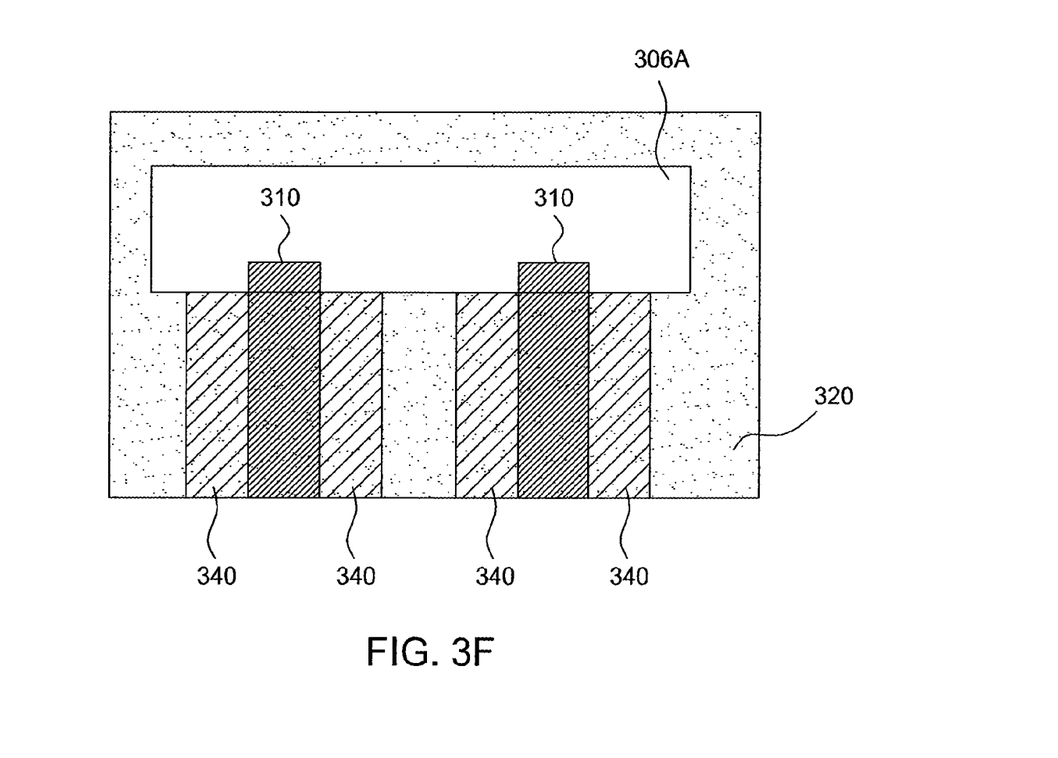

The spacer mask 314 is cropped to form a cropped spacer mask 340. The spacer mask 314 may be cropped by any etch process that removes the exposed portions of the spacer mask 314. As illustrated, the end-portions 316, selective to the photoresist stack 320 and the second hardmask layer 306A are removed. Alternatively, the etch may not be selective to the exposed portions of the sacrificial mask 310. Preferably, the cropping etch process is selective to the exposed portions of the sacrificial mask 310, as depicted in FIG. 3F. As such, any material and etch process combination described for the etching of the spacer layer 312 in association with FIGS. 3C and 3D may be used to form the cropped spacer mask 340.

Figure 3G:
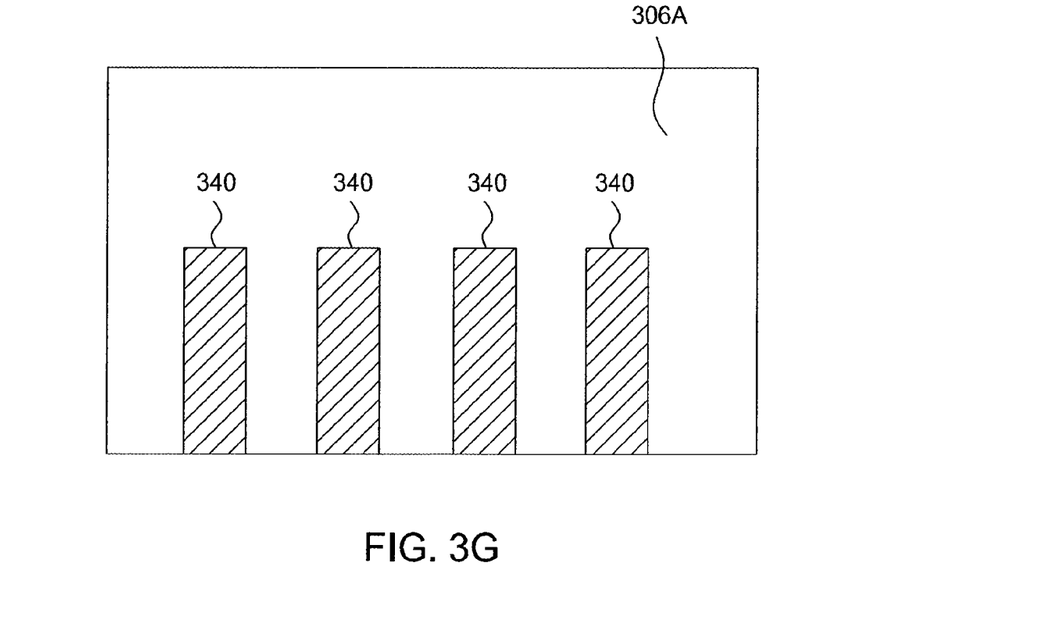

Referring to FIGS. 3G and 3G', the photoresist stack 320 and the sacrificial mask 310 are removed. Thus, in accordance with an embodiment of the present invention, the sacrificial mask 310 is retained to provide structural support through the cropping of the spacer mask 314 to form the cropped spacer mask 340. However, once the cropped spacer mask is formed, the sacrificial mask 310 may be removed to complete the frequency doubling mask fabrication process.

The photoresist stack 320 may be removed in the same process operation as the removal of the sacrificial mask 310 or in a preceding process operation. In one embodiment, the photoresist stack is comprised of carbon-containing species and is removed in a preceding wet or dry ash operation utilizing the gases $O_2$ and $N_2$. The sacrificial mask 310 or sacrificial hard mask portions 310A/310B may be removed by any technique that is highly selective to the cropped spacer mask 340 and the second hardmask layer 306A. For example, the sacrificial mask 310 is removed by a single etch operation selected from the group consisting of a hot $H_3PO_4$ wet etch, an aqueous hydrofluoric acid wet etch, or a SiCoNi etch. Alternatively the sacrificial mask 310 may be removed by a selective dry etch process, for example, a single etch operation selected from the group consisting of a $Cl_2$ plasma etch and a $CF_4/O_2$ plasma etch.

Figure 3H:
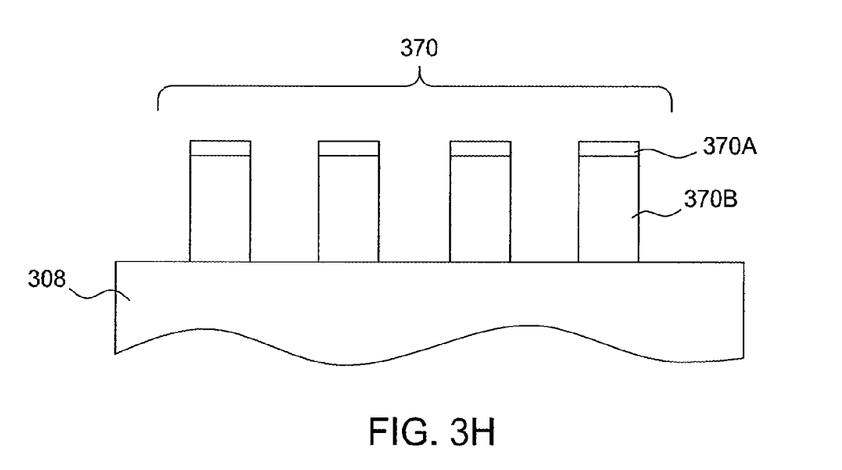

Referring to FIG. 3H, the image of the cropped spacer mask 340 is transferred to the second mask stack 306 to form the etch mask 370 or etch mask portions 370A/370B above the semiconductor layer 308. The second mask stack 306 may comprise a single material and is etched to form the etch mask 370 in a single etch operation. Alternatively, the etch mask portions 370A/370B may be formed by a two step etch process to layer 370A in a first step and layer 370B in a second step.

In one embodiment, the second mask layer 306B is comprised of an amorphous carbon material, such as the amorphous carbon material described in association with an embodiment of the composition of the first mask layer 304B. In a particular embodiment, the thickness of the second mask layer 306B and, hence, the mask portion 370B of the etch mask 370 is in the range between about 3.125 and about 6.875 times the width of each of the lines of the etch mask 370. The second mask layer 306B may be etched to form the mask portion 370B by any etch process that maintains a substantially vertical profile for each of the lines of the etch mask 370, as depicted in FIG. 3H. In one embodiment, the second mask layer 306B is comprised of amorphous carbon and is removed with a dry etch process using a plasma comprised of gases selected from the group consisting of the combination of $O_2$ and $N_2$ or the combination of $CH_4$, $N_2$ and $O_2$.

Through various embodiments, one or more methods to fabricate an etch mask 370 comprised of lines that double the frequency of the lines from a sacrificial mask have been described. The etch mask 370 may then be used to pattern a semiconductor layer 308 for, for example device fabrication for an integrated circuit. In accordance with an embodiment of the present invention, the etch mask 370 has a mask portion 370B comprised substantially of an amorphous carbon material. Alternatively, the image of a cropped spacer mask is first transferred to a layer comprising an amorphous carbon material prior to transferring the image to a semiconductor layer, as described in association with FIGS. 3G and 3H.

The semiconductor layer 308 may be any layer desirable for device fabrication or any other semiconductor structure fabrication requiring a double frequency mask. For example, in accordance with an embodiment of the present invention, the semiconductor layer 308 comprises any material that can be suitably patterned into an array of distinctly defined semiconductor structures. In one embodiment, the semiconductor layer 308 is comprised of a group IV-based material or a III-V material. Additionally, the semiconductor layer 308 may comprise any mor phology that can suitably be patterned into an array of distinctly defined semiconductor structures. The morphology of the semiconductor layer 308 may be selected from the group consisting of amorphous, mono-crystalline and poly-crystalline. The semiconductor layer 308 may further comprise charge-carrier dopant impurity atoms. The semiconductor layer 308 may further reside above a substrate. The substrate may be comprised of any material suitable to withstand a fabrication process, for example, the substrate is comprised of a flexible plastic sheet. The substrate may further be comprised of a material suitable to withstand a manufacturing process and upon which semiconductor layers may suitably reside. In an embodiment, the substrate is comprised of group IV-based materials such as crystalline silicon, germanium or silicon/germanium, or alternatively, the substrate is comprised of a III-V material. The substrate may also comprise an insulating layer. In one embodiment, the insulating layer is comprised of a material selected from the group consisting of silicon oxide, silicon nitride, silicon oxy-nitride and a high-k dielectric layer.

In various embodiments of the present invention, spacer layers 126 or 312 may be formed of boron nitride, which may be doped or include hydrogen, chlorine, silicon, oxygen, or carbon. In these embodiments, the resulting spacer layers have a k value between about 1.1 and about 10, such as between 3.0 and 6.0. The boron nitride layers may also be stress nitride layers having a stress between 10 GPa compressive and 10 GPa tensile, such as a tensile stress that is greater than about 2.0 GPa or a compressive stress that is less than about −3.5 GPa. In addition, boron nitride layers may be deposited by PECVD process at temperature less than 500° C. In one embodiment, the process temperature is between about 100° C. to about 1000° C., such as between about 300° C. to about 500° C., for example between about 400° C. and about 450° C.

Preferred boron nitride material layers have a high step coverage and low pattern loading effect. As defined herein, layers with a high step coverage have a lower percentage of layer thickness difference between different surfaces of a feature, i.e., sidewalls, top, and bottom, than layers with low step coverage. The pattern loading effect (PLE) is defined as the percentage of layer thickness difference between a layer thickness on portion, such as the bottom, top, or sidewall, of a feature in a substrate region with a few features (an isolated area) and a layer thickness on a corresponding portion of a feature in a substrate region with high density of features (a dense area), and thus, a lower pattern loading effect percentage reflects a higher layer thickness uniformity across a substrate.

In one embodiment, the spacer layers are formed from boron-nitride by reacting a gas mixture including a boron-containing precursor, a nitrogen-containing precursor, and, optionally, an inert gas under plasma conditions in a PECVD chamber. A suitable PECVD chamber is a DxZ™ chamber commercially available from Applied Materials Inc., located in Santa Clara, Calif.

The boron-containing precursors include diborane ($B_2H_6$), $B_2H_6$, borazine ($B_3N_3H_6$), an alkyl-substituted derivative of borazine, tri-methyl borine, ($B(CH_3)_3$), $BCl_3$, and combinations thereof. The nitrogen-containing precursor may include ammonia, hydrazine ($N_2H_4$), and combinations thereof. Suitable inert gases include helium (He), argon (Ar), nitrogen ($N_2$), xenon (Xe) or combinations thereof, among others. Additionally, the nitrogen-containing precursor may be diluted with a dilution gas such as argon, helium, hydrogen, or xenon.

In doped boron nitride layers, one or more compounds selected from the group consisting of a silicon-containing compound, a carbon-containing compound, a, and combinations thereof may also be introduced into the chamber during the deposition of the boron nitride layer. Alternatively, the compound may be introduced into the chamber before or after the deposition of the boron nitride layer.

Suitable compounds that may be introduced to the boron nitride material layer include, but are not limited to, silicon-containing precursors, such as silane, trisilylamine (TSA), trimethylsilane (TMS), silazanes, hexamethylcyclotrisilazane (HMCTZ), $SiH_xR_{(4-x)}$ with r being an alkyl group, halogen derivatives thereof, and combinations thereof, carbon-containing precursors having the general formula $C_xH_{2x+2}$, such as methane ($CH_4$), $C_xH_{2x}$, such as ethylene ($C_2H_4$), $C_xH_{2x-2}$, and combinations thereof, and oxygen-containing precursors, such as oxygen ($O_2$), ozone ($O_3$), nitric oxide (NO), nitrous oxide ($N_2O$), carbon dioxide ($CO_2$), water ($H_2O$), and combinations thereof, and phosphorous-containing compounds, such as phosphine ($PH_3$), may be introduced into the processing chamber for the boron-nitride deposition process. Further details of the methods for depositing boron-nitride layers and the physical properties thereof are disclosed in commonly assigned U.S. patent application Ser. No. 11/765,257, filed on Jun. 19, 2007 and U.S. Provisional Patent Application Ser. No. 60/949,796, filed on Jul. 13, 2007, which are incorporated herein by reference to the extent not inconsistent herewith.

The boron nitride layer may be deposited on the substrate in the chamber from the boron-containing precursor in the presence or absence of plasma in the chamber. Suitable deposition chambers that may be used include the PRODUCER® SE and PRODUCER® GT PECVD chambers, both of which are available from Applied Materials, Inc. of Santa Clara, Calif. The processing conditions provided herein are provided for a 300 mm PRODUCER® SE chamber with two isolated processing regions, with one substrate per processing region. Thus, the flow rates experienced per each substrate processing region and substrate are half of the flow rates into the chamber.

The substrate on which the boron nitride layer is deposited may be a silicon, silicon-containing, or glass substrate. The substrate may be a bare substrate or have one or more layers of material deposited thereon and/or features formed therein.

In one embodiment, a boron nitride layer is deposited by a thermal decomposition process, i.e., a non-plasma process. For deposition of the boron nitride layer in the absence of a plasma in the chamber, the temperature of a substrate support in the chamber may be set to between about 100° C. and about 1000° C., for example, between about 300° C. and about 500° C., and the pressure in the chamber may be between about 10 mTorr and about 760 Torr, for example, between about 2 Torr and about 20 Torr, during the deposition. The boron-containing, nitrogen-containing, carbon-containing, oxygen-containing and silicon-containing precursors may be introduced in the chamber at the same time, each at a respective flow rate between about 5 sccm and about 50 slm, such as between 10 sccm and about 1 slm. The inert gas may be introduced into the chamber at a flow rate between about 5 sccm and about 50 slm, such as between about 1 slm and about 10 slm. The spacing between a showerhead of the chamber and the substrate support may be between about 50 mils and about 5000 mils.

One example of a thermal boron-nitride deposition process includes introducing diborane at a flow rate of 2400 sccm, introducing ammonia at a flow rate of 800 sccm, introducing nitrogen at a flow rate of 2400 sccm, through a showerhead spaced 250 mils from a substrate surface, at a chamber pressure of 20 Torr for 15 seconds.

Optionally, a plasma may be generated for the above boron nitride deposition process by applying a RF power to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, for example, about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, for example, 13.6 MHz. Alternatively, the RF power may be provided at a mixed frequency including a first frequency between about 100 kHz up to about 1 MHz, for example, about 300 kHz to about 400 kHz at a power level between about 2 W and about 5000 W, such as between about 30 W and about 1000 W, and a second frequency of greater than about 1 MHz, such as greater than about 1 MHz up to about 60 MHz, for example, 13.6 MHz, at a power level between about 2 W and about 5000 W, such as between about 30 W and about 1000 W.

The embodiments in which the boron-containing precursor and the nitrogen-containing precursor are reacted in the presence of a plasma provide boron nitride layers that have properties that are desirable for hardmask applications. Boron nitride may be used as a hardmask application for polysilicon, silicon, tungsten, and dielectric etch processes. For example, wet etch rate ratios (100:1 HF) of 0.03 and 0.3 for thermal oxide and thermal nitride, respectively, have been obtained. Argon may be added to the precursor mixture to lower the dielectric constant of the layers and increase the breakdown voltage. The boron-nitride layers also have properties that are desirable for back-end of line applications such as copper barrier layers.

In an exemplary embodiment, diborane diluted with nitrogen and ammonia are introduced into a chamber and reacted in the presence of a plasma provided by RF power to deposit a boron nitride layer on a substrate in the chamber. The diborane was introduced into the chamber at a flow rate of about 3000 sccm, 5% in $N_2$, and the ammonia was introduced into the chamber at a flow rate of about 150 sccm. The RF power was provided at about 300 W at a frequency of 13.6 MHz. The chamber pressure was about 6 Torr, and the spacing was about 480 mils. Boron nitride layers with low wet etch rates, high deposition rates, and desirable, low dielectric constants were obtained.

In a further embodiment in which the boron-containing precursor and the nitrogen-containing precursor are introduced simultaneously, a silicon-containing precursor may also be introduced into the chamber with the boron-containing precursor and the nitrogen-containing precursor to form a SiBN layer for spacer applications. The SiBN layer may have a dielectric constant of less than 5.5, a breakdown voltage of greater than 6 MV/cm, and a leakage current of less than $1e^{-9}$ amps/cm$^2$ at 2 MV. Exemplary processing conditions for depositing a SiBN layer include introducing the precursor at 60 sccm $SiH_4$, 600 sccm $NH_3$, 1000 sccm $N_2$, 100-1000 sccm $B_2H_6$, generating a plasma at 100 W RF power at 13.6 MHz, while maintaining chamber conditions at a chamber pressure of 6 Torr, and a spacing of 480 mils. Optionally, the SiBN layer may be UV cured for 10 minutes at 400° C.

Following deposition, the boron nitride material layer may be treated to modify the layer properties, such as breakdown, dielectric constant, or composition. Post-deposition treatments include a plasma process, an ultraviolet (UV) cure process, a thermal anneal process, e-beam cure and combinations thereof.

In embodiments in which the treatment comprises a plasma process, the plasma process may be performed in the same chamber in which the boron nitride layer was deposited or a different chamber. The plasma may be provided by RF power delivered to a showerhead electrode and/or a substrate support electrode of the chamber. The RF power may be provided at a power level between about 2 W and about 5000 W, such as between about 30 W and about 1000 W, at a single low frequency of between about 100 kHz up to about 1 MHz, for example, about 300 kHz to about 400 kHz, or at a power level between about 2 W and about 5000 W, such as between about 30 W and about 1000 W, at a single high frequency of greater than about 1 MHz, such as greater than about 1 MHz up to about 60 MHz, for example, 13.6 MHz. Alternatively, the RF power may be provided at a mixed frequency including a first frequency between about 100 kHz up to about 1 MHz, for example, about 300 kHz to about 400 kHz at a power level between about 2 W and about 5000 W, such as between about 30 W and about 1000 W, and a second frequency of greater than about 1 MHz, such as greater than about 1 MHz up to about 60 MHz, for example, 13.6 MHz, at a power level between about 2 W and about 5000 W, such as between about 30 W and about 1000 W.

The plasma treatment may use a plasma treatment gas comprising a nitrogen-containing precursor and/or one or more dilution or inert gases with the nitrogen-containing precursors including $N_2$, $NH_3$, $N_2H_4$, or combinations thereof, and dilution gases that may include Ar, He, $H_2$, Xe, or combinations thereof. The plasma treatment gas may be introduced into the chamber at a flow rate of between about 5 sccm and about 50 slm, such as between about 100 sccm and about 500 sccm, during the treatment. The plasma gas may be flowed into the chamber for a period of time, such as between about 1 second and about 2 hours, such as between about 1 second and about 60 seconds. The chamber pressure may be between about 10 mTorr and about 760 Torr, and the temperature of a substrate support in the chamber may be between about 20° C. and about 1000° C. during the treatment. Increased high frequency RF power, increased $NH_3$ flow rates, and longer treatment times of the plasma process can be used to lower the refractive index of the resulting layers and increase the dielectric properties of the layers. Examples of chambers that may be used for the plasma process are the PRODUCER® SE and PRODUCER® GT PECVD chambers.

In embodiments in which the treatment comprises a UV cure process, the UV cure process may be performed in the same chamber as the deposition chamber or in a chamber which is part of an integrated tool that includes the deposition chamber in which the boron nitride layer was deposited. For example, the UV cure process may be performed in a NANOCURE™ chamber that is part of a PRODUCER® platform that includes a PECVD chamber in which the boron nitride layer is deposited.

Exemplary UV cure process conditions that may be used include a chamber pressure of between about 10 mTorr and about 760 Torr and a substrate support temperature of between about 20° C. and about 1000° C. The substrate support temperature for the UV cure process may be greater than, less than, or equal to the substrate support temperature during the deposition process.

The UV cure process may use a processing gas comprising an inert gas, a nitrogen-containing gas, an oxygen-containing gas, or combinations thereof, which may be introduced into the chamber at a flow rate of between about 5 sccm and about 50 sccm during the treatment. The processing gas may be flowed into the chamber for a period of time such as between about 1 second and about 2 hours, such as between about 1 second and about 10 minutes. The UV radiation may be provided by any UV source, such as mercury microwave arc lamps, pulsed xenon flash lamps, or high-efficiency UV light emitting diode arrays. The UV radiation may have a wavelength of between about 170 nm and about 400 nm, for example. The UV radiation may have a single wavelength, such as 172 nm. Alternatively, the UV radiation may be provided by a broad band UV source that provides wavelengths greater than about 200 nm. The treatment may comprise exposing the deposited material to between about 1 Watt/cm$^2$ and about 1000 Watts/cm$^2$ of ultraviolet radiation, and the ultraviolet radiation may provide a photon energy (electronVolts)

between about 0.5 eV and about 10 eV, such as between about 1 eV and about 6 eV. An example of a chamber that may be used to perform a UV cure process post-treatment is a NANOCURE™ chamber, available from Applied Materials, Inc. of Santa Clara, Calif.

Typically, the UV cure process removes hydrogen from the layer, which is desirable as hydrogen can diffuse through the layer and into semiconducting regions of the substrate and degrade reliability of a device formed on the substrate. The UV cure process also typically densifies the layer and increases the tensile stress of the layer to greater than about 2.0 GPa.

In embodiments in which the treatment comprises a thermal process, the thermal process may be performed in the same chamber in which the boron nitride layer was deposited or a different chamber. The deposited material is annealed at a temperature that is above the deposition temperature. A processing gas, as described above for the UV beam cure, may be introduced into the chamber at a flow rate of between about 5 sccm and about 50 slm, such as between about 10 sccm and about 1 slm, during the treatment. The processing gas may be flowed into the chamber for a period of time such as between about 1 second and about 10 hours, such as between 10 seconds and about 20 minutes. The chamber pressure may be between about 10 mTorr and about 760 Torr, and the temperature of a substrate support in the chamber may be between about 20° C. and about 1000° C. during the treatment. Examples of chambers that may be used for the thermal anneal process are the PRODUCER® SE and PRODUCER® GT PECVD chambers.

Further embodiments include treating the deposited material with two or more of the treatments described above, i.e., UV cure processes, plasma processes, and thermal processes. For example, the deposited material may be treated with a UV cure process and then a plasma process.

For applications in which high step coverage and a minimal pattern loading effect are required, such as when the boron nitride layer is deposited as a spacer layer over a gate stack, multiple cycles of deposition and post-deposition treatment may be performed. One or more layers of material may be deposited sequentially or simultaneously under plasma conditions in plasma enhanced chemical vapor deposition reactors at temperature equaling to or less than 500° C. to produce a composite spacer layer having an overall k value of about 1.1 to about 10.

Although the deposition and post-treatment steps described above are described with respect to a single deposition step followed by a single post-treatment step, boron nitride layers provided according to other embodiments of the invention may be formed by multiple cycles of deposition and post-treatment. In such embodiments, boron nitride material is deposited to a thickness that is only a fraction of the desired final thickness and then post-treated. This deposition and post-treatment sequence may be performed multiple times until a desired thickness is achieved. For example, layers having a thickness of about 2 Å to about 5000 Å, for example, about 2 Å to about 1000 Å, for example, about 20 Å layers, may be formed in each cycle. The deposition and post-treatment steps in each cycle can be performed in the same chamber, in different chambers that share a common transfer chamber, or in different chambers that do not share a common transfer chamber.

In one example of the boron nitride deposition process, a step coverage of greater than 95% and a pattern loading effect of less than 5% were obtained when a boron nitride layer was formed under the following conditions: depositing a boron nitride layer at a deposition rate of 20 Å per cycle using 400 sccm of diborane and 2000 sccm of nitrogen at a chamber pressure of 6 Torr and a spacing of 480 mils for 5 seconds/cycle; and treating the boron nitride layer with a plasma process to incorporate nitrogen into the layer and form a boron nitride layer, wherein the plasma process comprises using 100 sccm of ammonia and 2000 sccm of nitrogen for 10 seconds/cycle with 300 W of RF power at 13.6 MHz. The boron nitride layer had a dielectric constant of 4.7.

In another embodiment, a liner layer may be deposited on the spacer layers. Alternatively, the line layer may be deposited before and/or after the spacer layers. The liner layer may be deposited in situ with the spacer layer in the same chamber or same processing tool. The liner layer may comprise silicon nitride and can be deposited a deposition temperature of 1000° C. or less in a plasma enhanced CVD process or a thermal enhanced process. The silicon nitride deposition process including a silicon source, such as silane ($SiH_4$), a nitrogen source, such as ammonia ($NH_3$), and an inert gas, such as nitrogen gas ($N_2$).

The boron nitride material layers may also be used for hardmasks that may be sacrificial or left in structures after patterning. For example, the boron nitride material layers may be boron nitride or boron oxide layers that are hard masks for etching oxide, nitride, silicon, polysilicon, or metal layers. The boron nitride material layers may also be used for "gap-fill" applications with a dielectric liner. Boron nitride material layers have been effectively produce in a dual patterning scheme.

The boron nitride material layers may also be used for back end applications, such as copper barrier layers or as adhesion layers between copper and copper barrier layers, for example, by forming CuBN, CuPBN, or CuBCSiN layers there between. The copper barrier layers may be used in conventional damascene structures or structures that include air gaps that are formed by depositing and then removing a sacrificial material.

In addition to layer composition, other properties of the boron nitride material layers, such as refractive index (RI) and step coverage, can be tailored by introducing other precursors into the chamber during the introduction of the boron-containing precursor. Layers deposited using $B_2H_6$, $B_2H_6+NH_3$, $B_2H_6+SiH_4$, and $B_2H_6+NH_3+SiH_4$ were compared. The $B_2H_6+SiH_4$ layers had the highest refractive index. Layers that were deposited using an additional precursor rather than $B_2H_6$ alone had improved uniformity. The $B_2H_6+NH_3+SiH_4$ layers had the best step coverage. For example, a bottom/top step coverage of 91%, a sidewall/top step coverage of 91%, a top PLE of 0%, a sidewall PLE of 7%, and a bottom PLE of 5% were obtained using the following conditions: 400 sccm $B_2H_6$ (5% in $N_2$), 40 sccm $SiH_4$, 200 sccm $NH_3$, 4000 sccm $N_2$ for 15 seconds followed by a nitrogen plasma treatment comprising 600 W RF power at 13.6 MHz, 100 sccm $NH_3$, and 6000 sccm $N_2$ for 15 seconds.

Table I shows a comparison of the properties of boron nitride material layers and silicon nitride materials.

TABLE I

| Layer Properties | SiN | BN | BN |
|---|---|---|---|
| Deposition Temperature | 480° C. | 400° C. | 480° C. |
| Deposition Rate (Å/min) | 500 | 400 | 1200 |
| Stress (MPa) | 800–1000 | −50 | −150 to −300 |
| Step Coverage (32 nm SADP Structures) | 80% | 100% | 100% |
| Wet Etch Rate Ratio (100:1 HF) Thermal oxide | 5–200 | 2.4 | ≦0.3 |

TABLE I-continued

| Layer Properties | SiN | BN | BN |
|---|---|---|---|
| Wet Etch Rate Ratio $H_3PO_4$ (250° C.) | 70 | 4.5 | 108 |
| Wet Etch Rate Ratio SPM (4:1 $H_2SO_4$:$H_2O_2$) | <0.1 | 3.7 | 4.5 |
| Step Coverage, | | | |
| S/T | 80% | 100% | 100% |
| B/T | 80% | 100% | 100% |
| Pattern Loading Effect (PLE) | ≦10% | <5% | <5% |

The boron nitride layers provided herein typically have a step coverage of greater than 80% when they are deposited on patterned substrates. The boron nitride material layers further seem to have less than 5% pattern loading and conformality of 95% or greater. Boron nitride has been observed to have desirable etch properties for spacer layer materials in process flow requiring hydrogen Fluoride (HF) wet cleaning or no cleaning steps. The boron nitride material layers also have good gap fill properties, for example, no void or seam formation in the filled gaps.

The silicon nitride material in Table 1 was deposited by flowing 100 sccm of silane ($SiH_4$), 900 sccm of ammonia ($NH_3$), 1000 sccm process of nitrogen ($N_2$), generating a plasma at 150 Watts with a chamber pressure of 6 Torr and a spacing between a showerhead and a substrate of 480 mils. The boron nitride materials in Table 1 for either 400° C. and 480° C. were deposited by flowing 2400 sccm of diborane ($B_2H_6$), 800 sccm of ammonia ($NH_3$), 2400 sccm process of nitrogen ($N_2$), generating a plasma at 150 Watts with a chamber pressure of 20 Torr and a spacing between a showerhead and a substrate of 480 mils.

It was observed that the etch rate of boron nitride materials in HF, $H_3PO_4$, and Pyranha solution ($H_2SO_4$:$H_2O_2$) decreases as the boron content of the film increases. It was also observed that the refractive index of the boron nitride material layer decreases with pressure while the B—N bonds in the deposited material increase with decreasing pressure. Boron nitride deposition rates were observed to increase with chamber pressures. Additionally, an increase in the boron concentration results in a reduced dry and wet etch rate, thereby, improving the etch selectivity to oxide etch stop layer. An etch selectivity of boron nitride material layer to oxide layer of between about 1:1 and about 1:100, such as between about 1:3.7 and 1:4.5, has been observed for boron nitride materials deposited according to the processes described herein.

While the foregoing is directed to embodiments of the present invention, other and further embodiments of the invention may be devised without departing from the basic scope thereof, and the scope thereof is determined by the claims that follow.

What is claimed is:

1. A method for fabricating a semiconductor mask, comprising:
   providing a semiconductor stack having a sacrificial mask disposed adjacent thereto;
   depositing a conformal boron nitride material layer on the sacrificial mask and semiconductor stack;
   etching the boron nitride material layer to provide a spacer mask having spacer lines adjacent to the sidewalls of the sacrificial mask and to expose the top surface of the sacrificial mask;
   depositing and patterning a photoresist layer above the spacer mask and the sacrificial mask to expose a portion of the spacer mask; and
   etching the exposed end-portions that are continuity between pairs of spacer lines prior to removing the sacrificial mask; and
   removing the sacrificial mask.

2. The method of claim 1, wherein the boron nitride material layer further comprises carbon, silicon, chlorine, oxygen, or combinations thereof.

3. The method of claim 1, wherein the boron nitride material layer comprises a base boron nitride material layer and a liner layer disposed on the base boron nitride material layer.

4. The method of claim 3, wherein the etching the boron nitride material layer to provide a spacer mask comprises anisotropic etching the liner layer to expose the base boron nitride material layer and isotropic etching the exposed base boron nitride material layer.

5. The method of claim 4, wherein the liner layer comprises silicon nitride and the sacrificial mask comprises a material selected from the group consisting of silicon nitride, silicon oxide, amorphous silicon, amorphous carbon, and combinations thereof.

* * * * *